US012660671B2

(12) United States Patent
Rabilas, Jr. et al.

(10) Patent No.: US 12,660,671 B2
(45) Date of Patent: Jun. 16, 2026

(54) SECURITY WIRE OVER STITCH BOND

(71) Applicant: Texas Instruments Incorporated, Dallas, TX (US)

(72) Inventors: Aniceto Rabilas, Jr., Angeles (PH); Ray Fredric De Asis, Mabalacal City (PH); Jason Colte, La Trinidad (PH)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 698 days.

(21) Appl. No.: 17/971,730

(22) Filed: Oct. 24, 2022

(65) Prior Publication Data

US 2024/0128228 A1 Apr. 18, 2024

Related U.S. Application Data

(60) Provisional application No. 63/416,800, filed on Oct. 17, 2022.

(51) Int. Cl.
| | |
|---|---|
| *H10W 74/01* | (2026.01) |
| *H10W 74/10* | (2026.01) |
| *H10W 72/00* | (2026.01) |
| *H10W 72/50* | (2026.01) |
| *H10W 90/00* | (2026.01) |

(52) U.S. Cl.
CPC .......... *H10W 74/01* (2026.01); *H10W 74/111* (2026.01); *H10W 72/075* (2026.01); *H10W 72/536* (2026.01); *H10W 72/5363* (2026.01);

*H10W 72/5438* (2026.01); *H10W 72/552* (2026.01); *H10W 72/5522* (2026.01); *H10W 72/5524* (2026.01); *H10W 72/5525* (2026.01); *H10W 90/755* (2026.01)

(58) Field of Classification Search
CPC ....... H01L 24/48; H01L 23/495; H10W 74/01
See application file for complete search history.

(56) References Cited

U.S. PATENT DOCUMENTS

| | | | |
|---|---|---|---|
| 10,770,378 B1 | 9/2020 | Tuncer | |
| 2016/0276185 A1 | 9/2016 | Samson et al. | |
| 2018/0331064 A1* | 11/2018 | Koo ......................... | H01L 24/85 |
| 2020/0020642 A1* | 1/2020 | Chuang ................... | H01L 24/48 |
| 2021/0066220 A1 | 3/2021 | Guevara et al. | |

* cited by examiner

*Primary Examiner* — Yu-Hsi D Sun

(74) *Attorney, Agent, or Firm* — Xiaotun Qiu; Frank D. Cimino

(57) ABSTRACT

An electronic device includes a package structure, a conductive terminal exposed outside the package structure, a semiconductor die in the package structure, and a bond wire having contiguous first and second portions. The first portion has a first end and a second end, the first end connected to the semiconductor die by a first bond and the second end connected to the conductive terminal by a second bond. The second portion has a first end and a second end, the first end of the second portion connected to the second end of the first portion, and the second end of the second portion connected to the conductive terminal by a third bond.

14 Claims, 18 Drawing Sheets

SECURITY WIRE OVER STITCH BOND

CROSS-REFERENCE TO RELATED APPLICATION

This application claims priority to and benefit of U.S. Provisional Patent Application Ser. No. 63/416,800, filed on Oct. 17, 2022, and titled "SECURITY WIRE OVER STITCH BOND", the contents of which are hereby fully incorporated by reference.

BACKGROUND

Weak connection strength between a bond wire/stitch bond and a lead frame can adversely affect bondability and reliability. Different wire bonding connection types such as ball bump over stitch bond and stitch bond over ball bump can improve connection strength between a bond wire/stitch bond and a lead frame. However, stress points are still present on ball bump over stitch bond and stitch bond over ball bump connections since the ball bump used is formed by heat through electronic flame-off which makes the ball bump harder compared to the bond wire/stitch bond.

SUMMARY

In one aspect, an electronic device includes a package structure, a conductive terminal exposed outside the package structure, a semiconductor die in the package structure, and a bond wire having contiguous first and second portions. The first portion has a first end and a second end, the first end connected to the semiconductor die by a first bond and the second end connected to the conductive terminal by a second bond. The second portion has a first end and a second end, the first end of the second portion connected to the second end of the first portion, and the second end of the second portion connected to the conductive terminal by a third bond.

In another aspect, a method of fabricating an electronic device includes attaching a semiconductor die to a die attach pad, performing a wire bonding process that includes coupling a first end of a first portion of a bond wire to the semiconductor die by a first bond, coupling a second end of the first portion and a first end of a second portion of the bond wire to a conductive terminal by a second bond, and coupling a second end of the second portion to the conductive terminal by a third bond, and performing a molding process that encloses the semiconductor die and the bond wire in a package structure.

In a further aspect, a wirebonding method includes coupling a second end of a first portion of a bond wire and a first end of a second portion of the bond wire to a conductive terminal by a stich bond or a wedge bond and coupling a second end of the second portion to the conductive terminal by a stitch bond.

DETAILED DESCRIPTION

Figure 1:
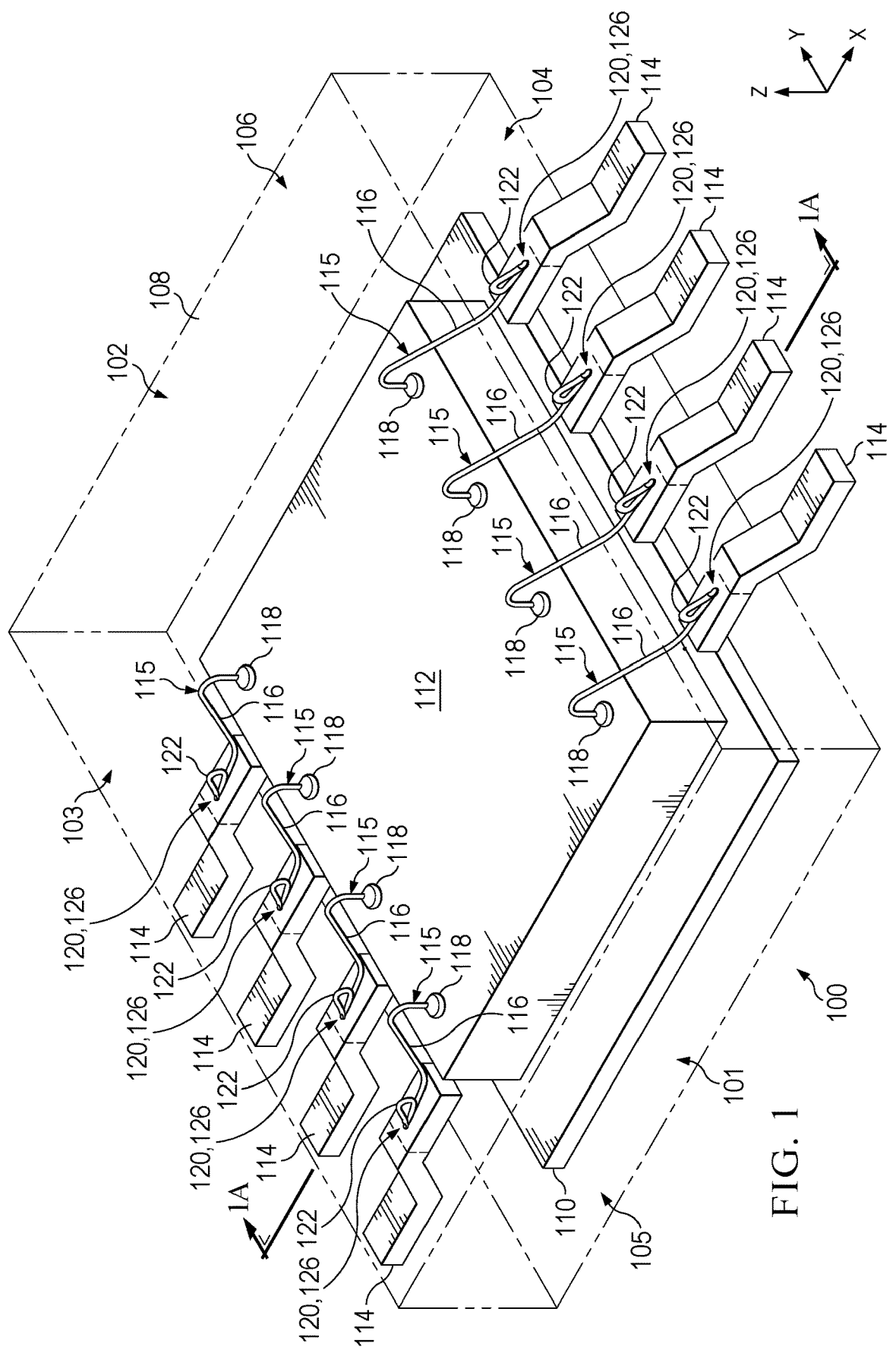
FIG. 1 is a top perspective view of an electronic device with bond wires having multiple bonds to conductive terminals.

In the drawings, like reference numerals refer to like elements throughout, and the various features are not necessarily drawn to scale. Also, the term "couple" or "couples" includes indirect or direct electrical or mechanical connection or combinations thereof. For example, if a first device couples to or is coupled with a second device, that connection may be through a direct electrical connection, or through an indirect electrical connection via one or more intervening devices and connections. One or more operational characteristics of various circuits, systems and/or components are hereinafter described in the context of functions which in some cases result from configuration and/or interconnection of various structures when circuitry is powered and operating. Unless otherwise stated, "about," "approximately," or "substantially" preceding a value means+/−10 percent of the stated value.

Figure 1A:
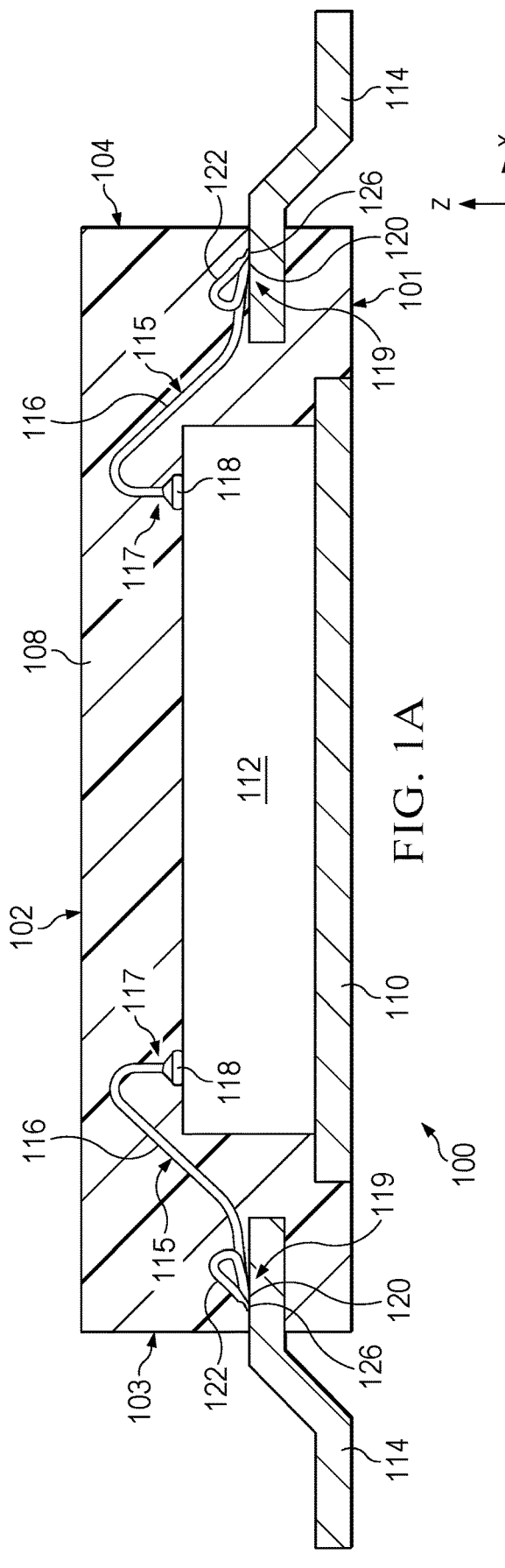
FIG. 1A is a sectional side elevation view of the electronic device taken along line 1A-1A of FIG. 1.
Figure 1B:
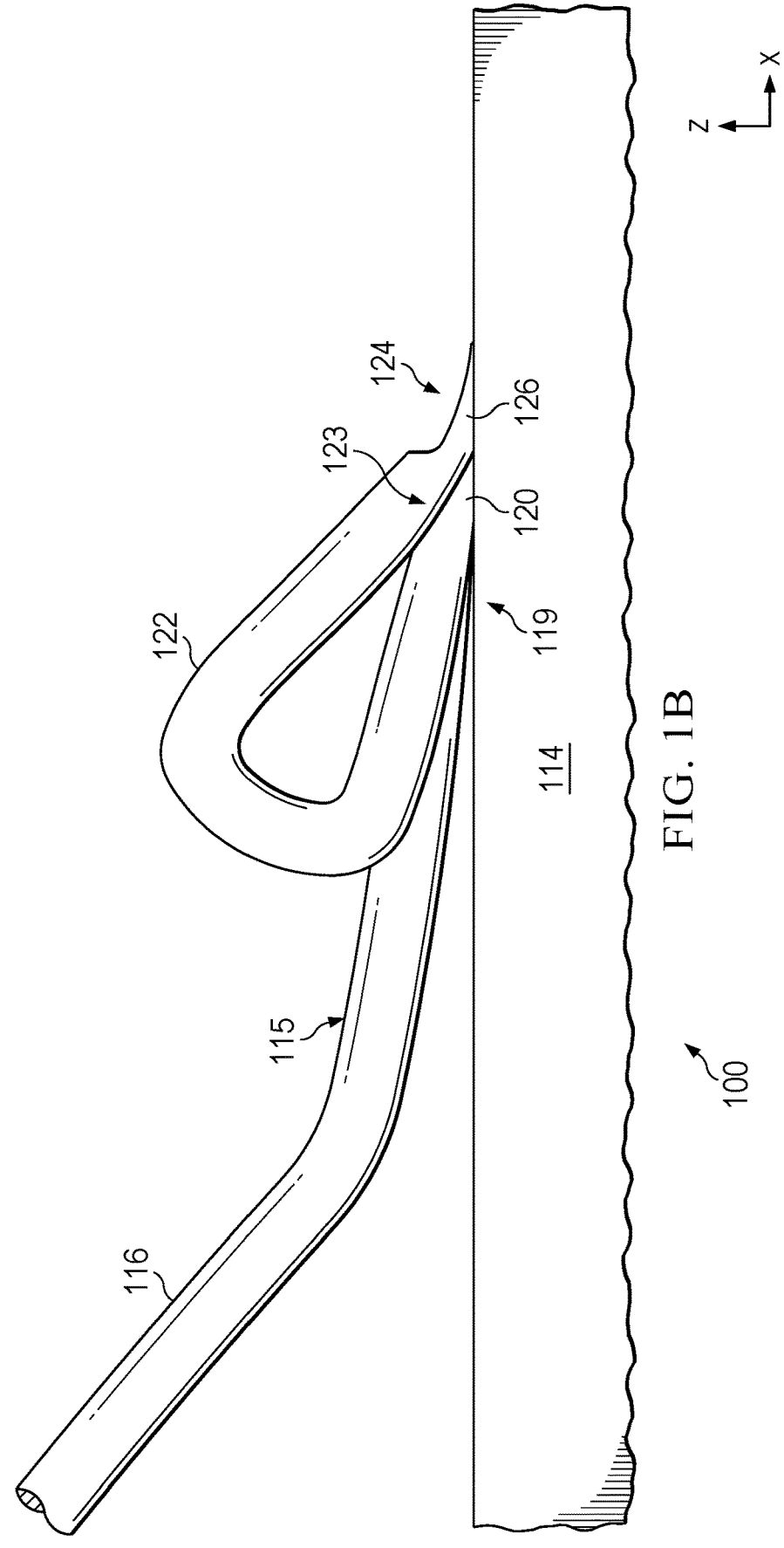
FIG. 1B is a partial side view of a bond wire in the electronic device of FIGS. 1 and 1A with contiguous first and second portions and multiple bonds to a conductive terminal.
Figure 1C:
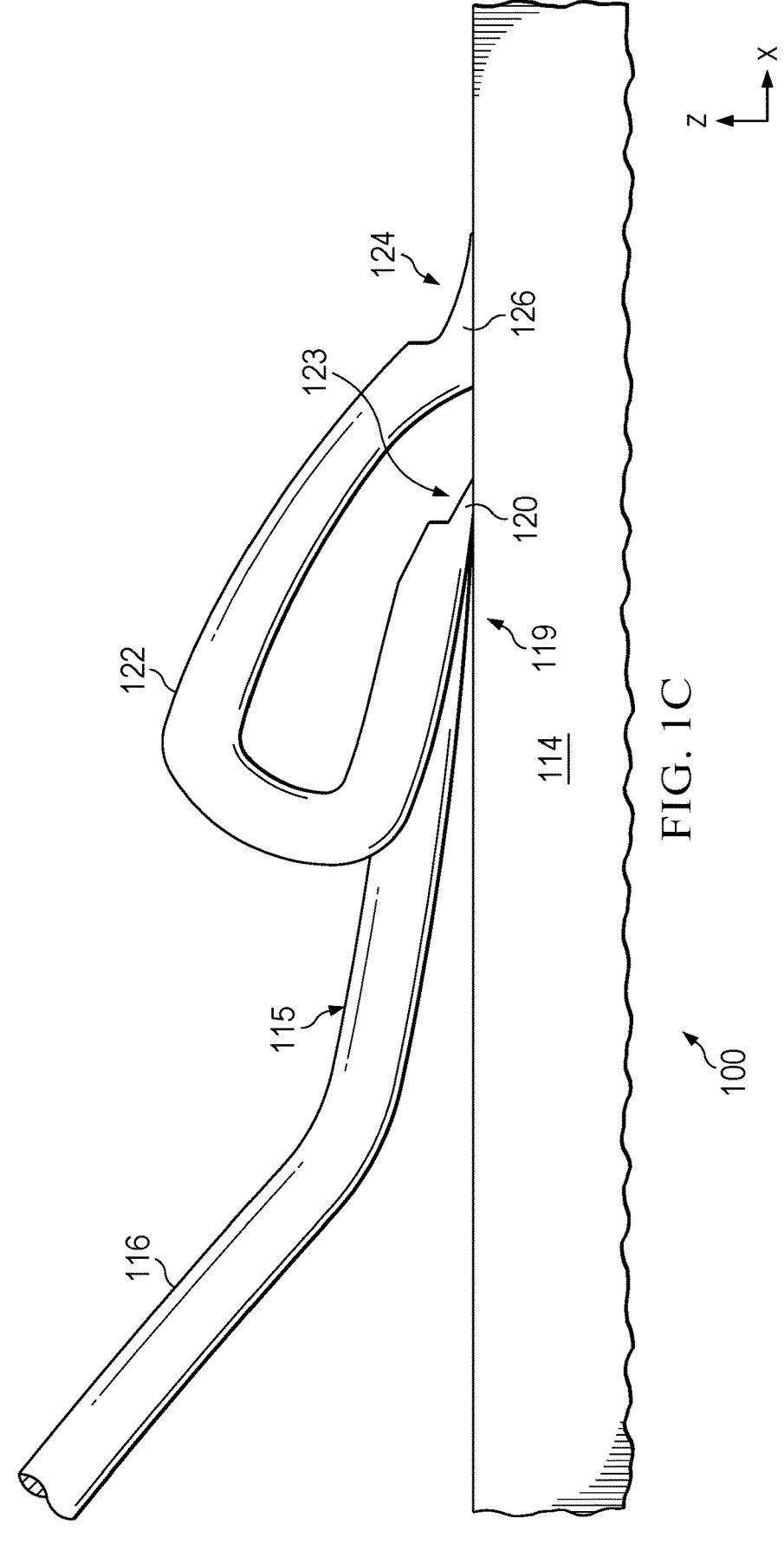
FIG. 1C is a partial side view of another bond wire in the electronic device of FIGS. 1 and 1A with contiguous first and second portions and multiple bonds to a conductive terminal.

Referring initially to FIGS. 1-1C, FIG. 1 shows an electronic device 100 with bond wires 115 having multiple bonds to conductive terminals 114 (e.g., leads), FIG. 1A shows a sectional side elevation view of the electronic device 100 taken along line 1A-1A of FIG. 1, and FIGS. 1B and 1C show partial side views of bond wires 115 in the electronic device 100. The electronic device 100 adds an additional loop, also referred to as a security wire, over a wedge or stitch bond to improve connection strength between the wire/stitch and the associated terminal 114 or lead frame. In addition, the example security wire over wedge or stitch bond implementations do not require any additional ball bump process, and thus do not add any additional stress points and do not add significant processing time, cost or complexity.

The electronic device 100 has a package structure 108 with a generally rectangular shape that includes opposite first and second (e.g., bottom and top) sides 101 and 102, respectively, and lateral third, fourth, fifth, and sixth sides 103, 104, 105, and 106, respectively. In one example, the package structure 108 is a molded plastic structure. In another implementation, the package structure is or includes a ceramic structure (not shown). The electronic device 100 is shown in FIGS. 1-1C in an example position or orientation in a three-dimensional space with a first direction X, a perpendicular (orthogonal) second direction Y, and a third direction Z that is perpendicular (orthogonal) to the respective first and second directions X and Y, and structures or features along any two of these respective directions are orthogonal to one another. In the illustrated orientation, the respective first and second sides 101 and 102 are spaced apart from one another along the third direction Z, the respective third and fourth sides 103 and 104 are spaced apart from one another along the first direction X, and the respective fifth and sixth sides 105 and 106 are spaced apart from one another along the second direction Y.

The electronic device 100 includes a die attach pad 110 and a semiconductor die 112 that is attached to the die attach pad 110 in the package structure 108, for example, by solder or an adhesive (not shown). The electronic device 100 has conductive metal gull wing terminals 114 along each of the respective third and fourth sides 103 and 104. In other example, the electronic device can have different types and forms of conductive terminals, such as J-type terminals, terminals of a ceramic or organic multilevel package substrate, through-hole terminals, etc. (not shown). In various implementations, conductive terminals can be located on one or more of the sides 101, 103, 104, 105, and 106, and the terminals can be flush with the associated side of the package structure 108 and/or can at least partially extend outward therefrom, and have a surface exposed outside the package structure 108 to allow soldering or socket connection to connect electrical circuitry of the semiconductor doe 112 to a host printed circuit board (PCB, not shown).

The bond wires 115 are enclosed by the package structure 108. The individual bond wires 115 have contiguous first and second portions 116 and 122, respectively. As best shown in FIGS. 1 and 1A, the first portion 116 of each bond wire 115 has a first end 117 and a second end 119. The first end 117 of the first portion 116 is connected to the semiconductor die 112, for example, to a conductive metal bond pad (not shown) by a first bond 118. In one example, the first bond 118 is a ball bond. The second end 119 of the first portion 116 is connected to the corresponding conductive terminal 114 by a second bond 120. In one example, the second bond 120 is a stitch bond. In another example, the second bond 120 is a wedge bond.

The second portion 122 of the bond wire 115 has a first end 123 and a second end 124. The first end 123 of the second portion 122 is connected to the second end 119 of the first portion 116, and the second end 124 of the second portion 122 is connected to the conductive terminal 114 by a third bond 126. In one example, the third bond 126 is a stitch bond. FIG. 1B shows one example, in which the third bond 126 extends on the second end 119 of the first portion 116 of the bond wire. FIG. 1C shows another example, in which the third bond 126 is spaced apart from the second end 119 of the first portion 116 along the first direction X. In the illustrated examples, the second portion 122 of the bond wire 115 includes a loop or other shape having one or more curved sections. The additional loop can also be referred to as a security wire that extends over the second bond 120 (e.g., over a wedge or stitch bond) to improve connection strength between the wire/stitch and the associated conductive terminal 114. In practice, the second portion 122 is formed during a single wirebonding operation that forms the bond wire 115 to form the connections to the conductive terminal 114 when connected to a lead frame panel structure prior to lead trimming and forming operations, and the addition of the security wire does not require any additional ball bump processing and does not add any additional stress points or add significant processing time, cost or complexity.

Referring also to FIGS. 2-15, FIG. 2 shows a method 200 of fabricating an electronic device with an included wirebonding method 202, and FIGS. 3-15 show the electronic device 100 of FIGS. 1-1C undergoing fabrication processing according to the method 200. In one example, the method 200 includes attaching a semiconductor die 112 to a die attach pad 110 at 201. The die attachment at 201 can include soldering (e.g., depositing solder paste on a metal die attach pad 110 in FIG. 1 above, attaching the semiconductor die 112 to the solder paste, and heating to reflow the solder paste and form a solder connection) or adhesive attachment (e.g., depositing adhesive, attaching the semiconductor die 112 to the adhesive, and activating the adhesive be heating, UV exposure, etc.). The die attach processing at 201 can be omitted in other implementations.

Figure 2:
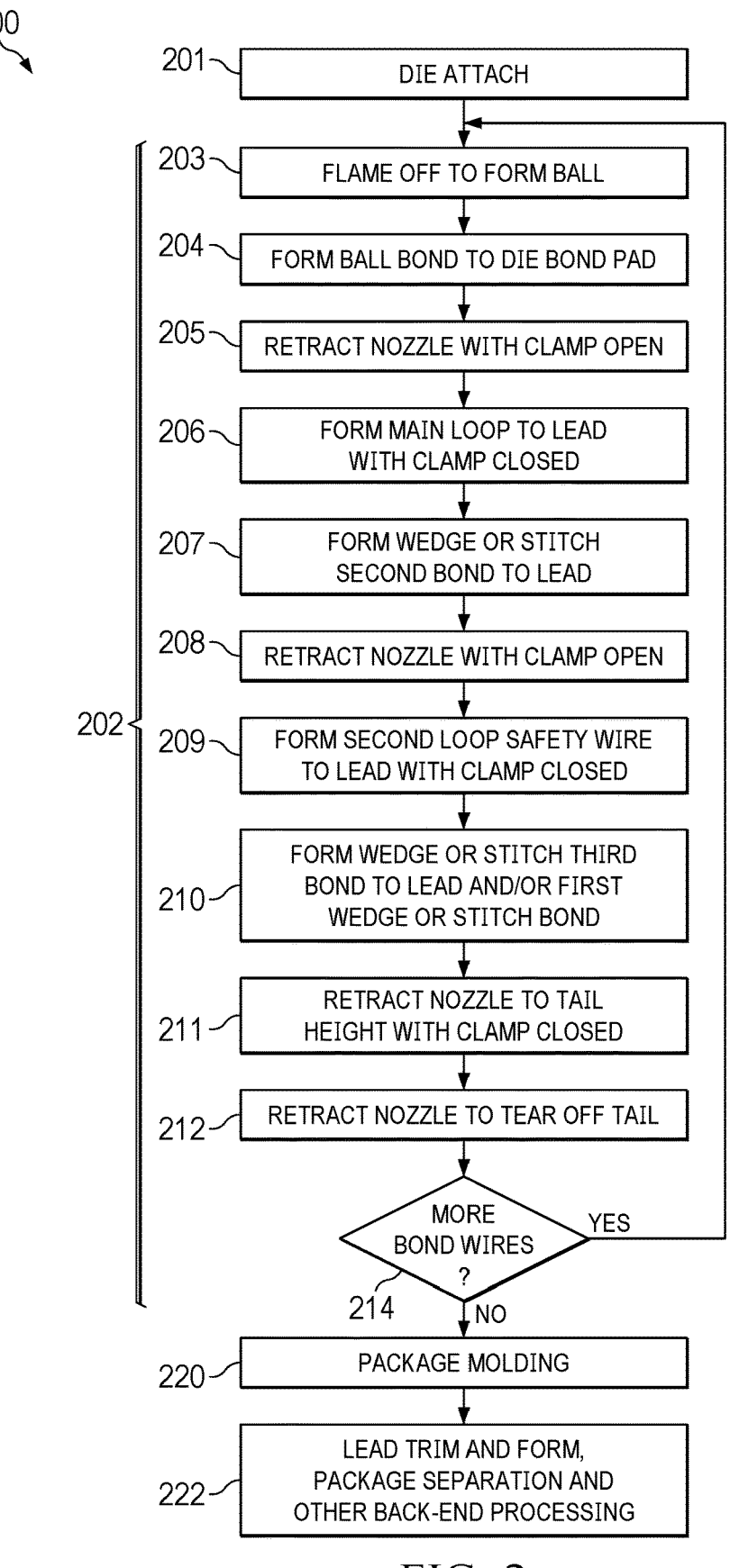
FIG. 2 is a flow diagram of a method of fabricating an electronic device with an included wirebonding method.

The method 200 in FIG. 2 has an included wirebonding method 202 for creating one or more bond wire interconnections in the device. FIGS. 3-12 illustrate an example wirebonding process 300 using a wirebonding tool with a nozzle 301 with a concentric channel through with a conductive wire 302 can be translated along the third direction Z and a clamp 304 to automatically control and selectively inhibit translation of the wire 302. The wirebonding at 202 can include any type or form of bond wire bonds and techniques, for example, one or more of ball bonding, wedge bonding, compliant bonding, etc., with or without externally applied heat, using any suitable conductive wire 302, for example, that is or includes aluminum, copper, silver, and/or gold of any suitable wire diameter. In one implementation, the wirebonding at 202 includes attaching the wire 115 at both ends and at the contiguous joinder of the respective first and second bond wire portions 116 and 122 using a combination of downward pressure, ultrasonic energy, and in some cases heat, to make a weld, where externally applied heat can be optionally used to make the metal softer, for example, in a thermosonic bonding implementation that combines external heat with ultrasonic energy during one or more bonding steps.

Figure 3:
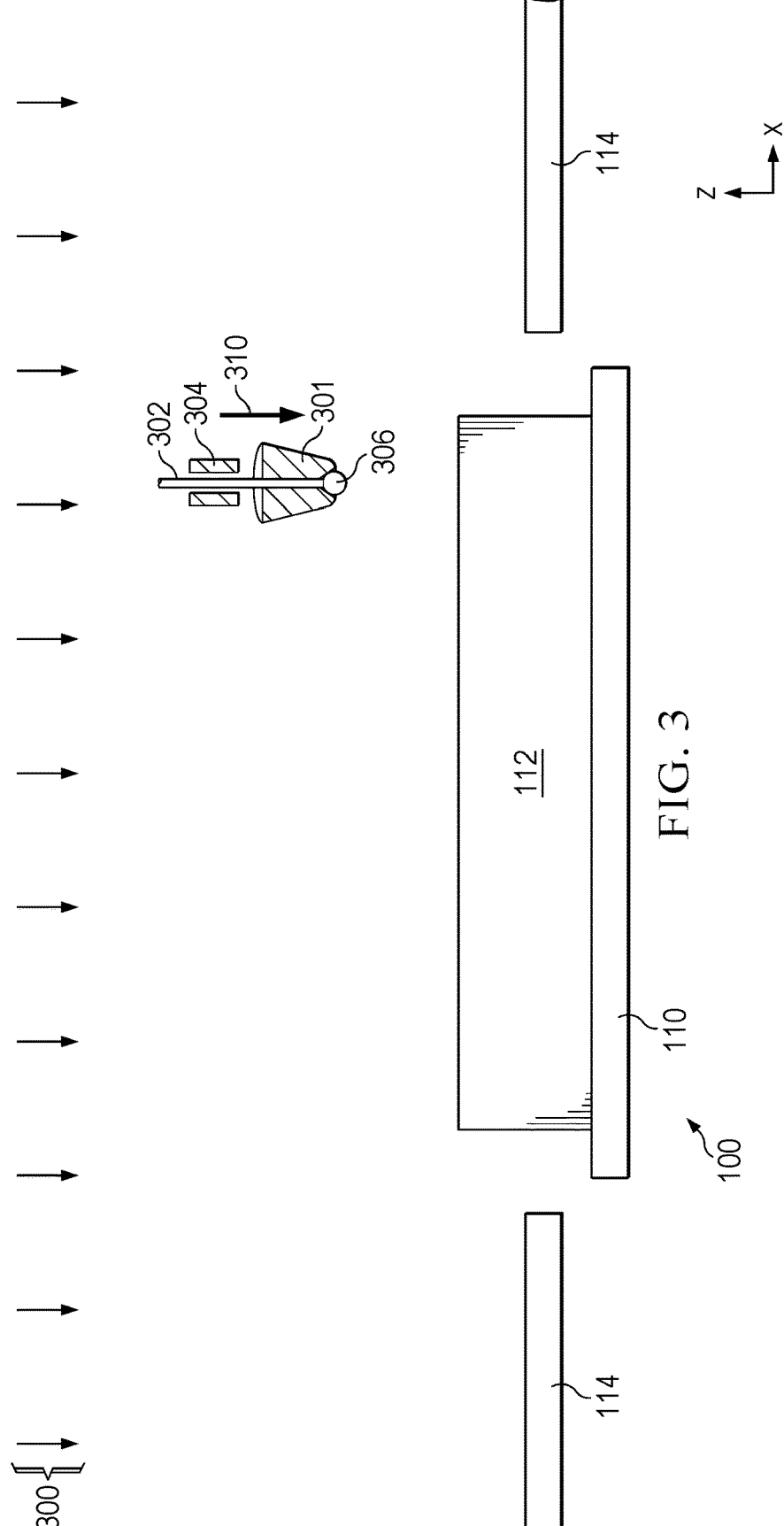
FIGS. 3-15 are partial side elevation views of the electronic device of FIGS. 1-1C undergoing fabrication processing according to the method of FIG. 2.

The wirebonding at 202 includes forming a first bond in creating a bond wire at 203 and 204. FIG. 3 shows one example, in which a molten metal ball is formed by a flame off process at 203 in FIG. 2. A position control apparatus (not shown) moves the nozzle 301 close to an electronic flame source (not shown). In one example, the system energizes an electronic flame source (not shown) to form a flame or arc to melt the end of the conductive wire 302 to form a ball 306 that is suspended by the remainder of the wire 302 while the clamp 304 remains closed.

Figure 4:
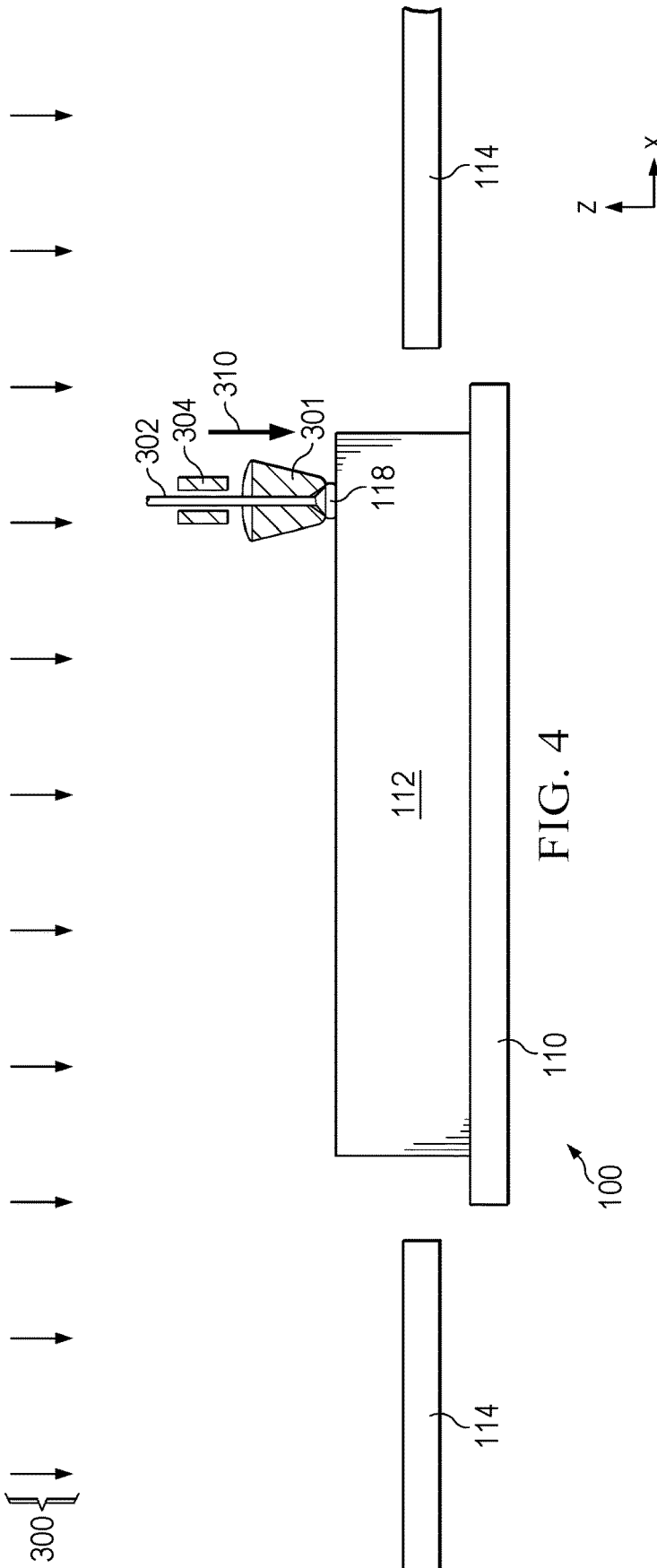
Figure 5:
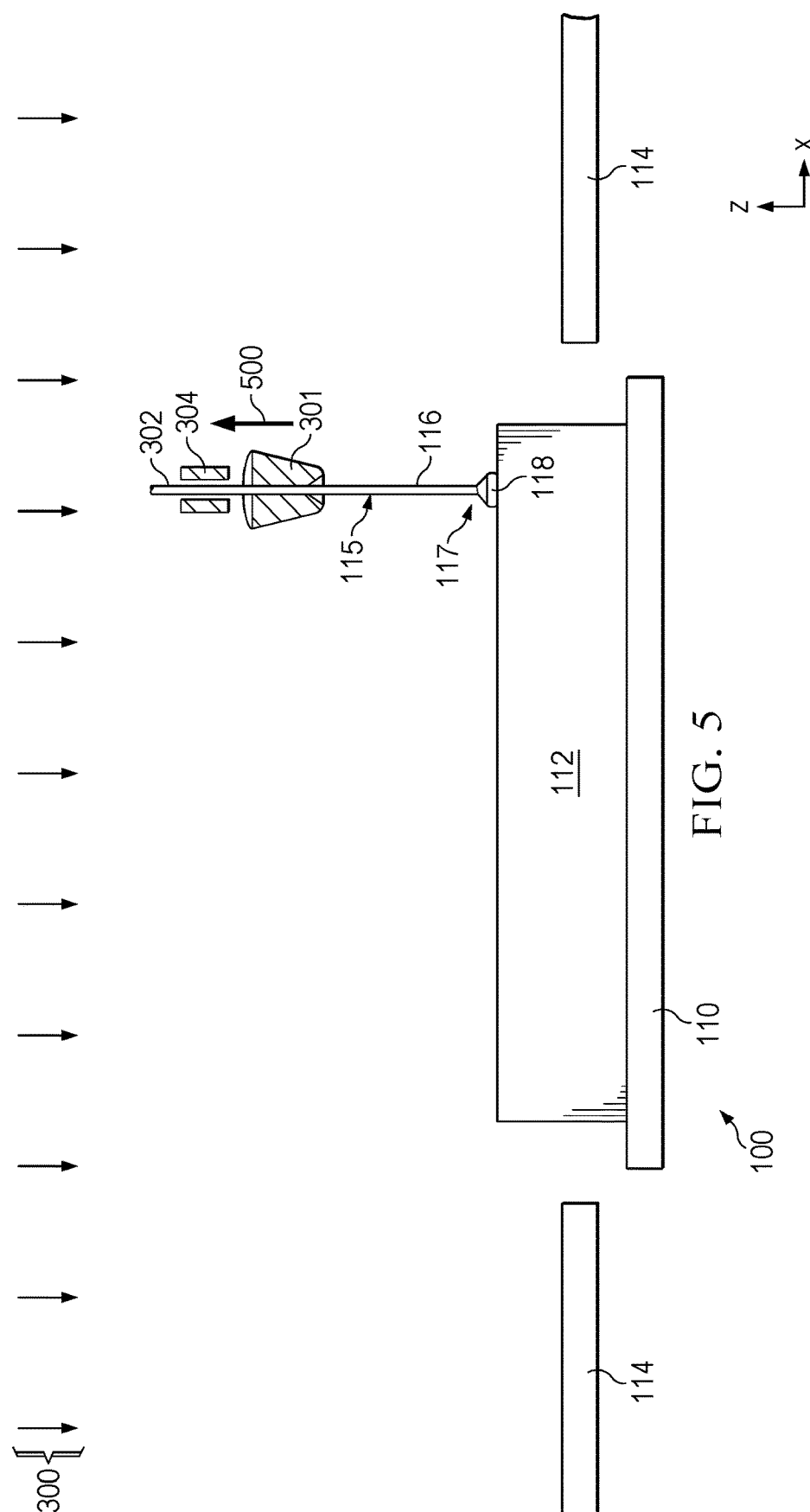

At 204, the first bond 118 is formed to a bond pad or other conductive feature of the semiconductor die. In one example, the coupling at 204 includes forming the first bond 118 as a ball bond. In one example, the clamp 304 is opened as shown in FIG. 3, and the position control apparatus moves the nozzle 301 downward in FIG. 3 along the direction 310 to move the ball 306 toward the bond pad (not shown) of the second semiconductor die 112 with the clamp 304 open. The downward movement of the nozzle 301 continues with the ball 306 touching the top side of the bond pad as shown in FIG. 4. The ball 306 progressively collapses and laterally spreads to form the first bond 118 (e.g., a ball bond) while the clamp 304 remains open. The ball bond 118 in this example couples the first end 117 of the first portion 116 of the prospective bond wire 115 to the semiconductor die 112. In one example, the position control apparatus vibrates the nozzle 301 at high (e.g., ultrasonic) frequencies to bond the ball 306 to the top side of the bond pad to form the first bond 118 as shown in FIG. 4, including lateral movement of the nozzle 301 back and forth along the first X direction, or in a circular pattern in an X-Y plane, to form the ball bond 118.

Figure 6:
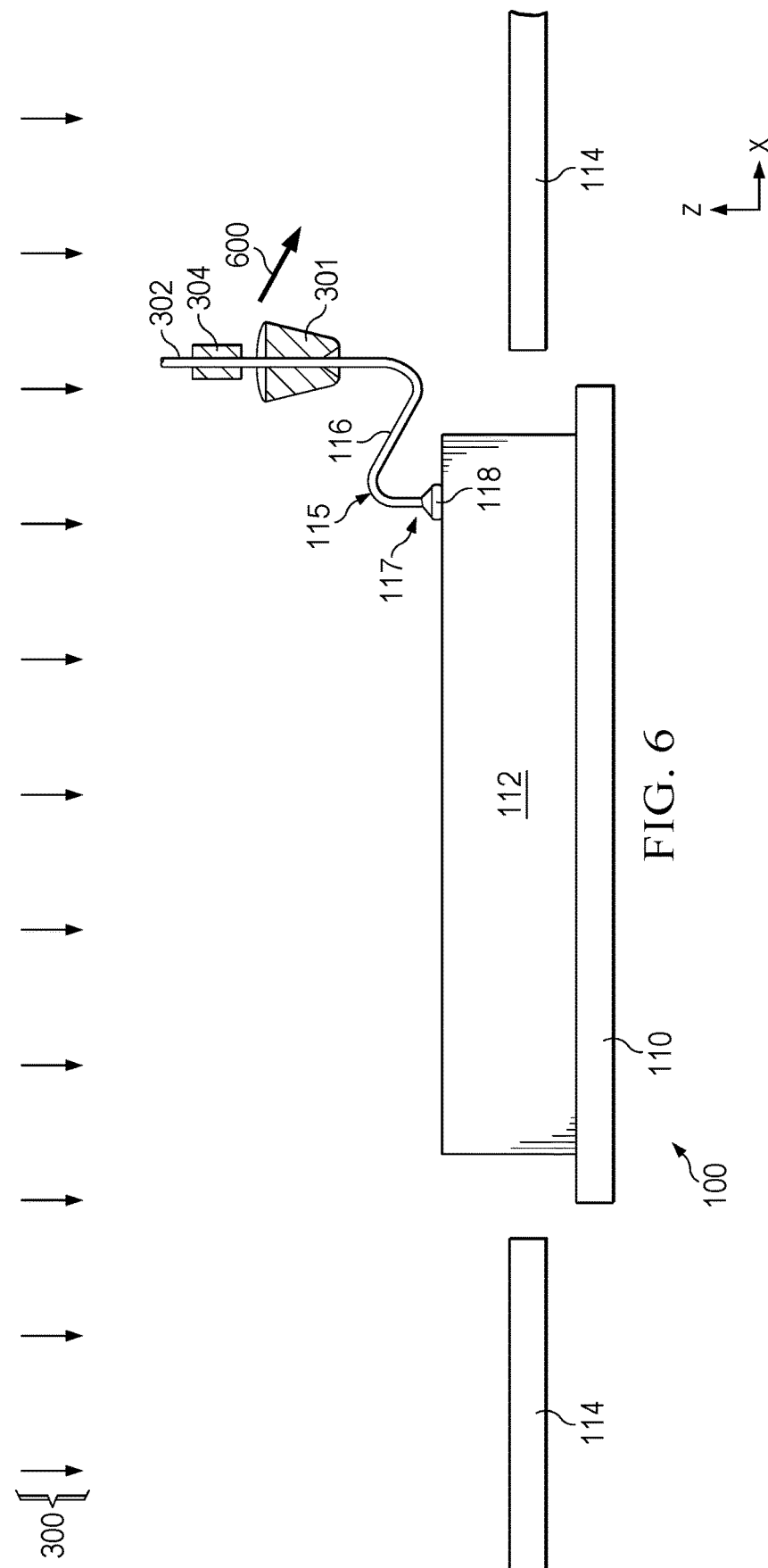

At 205 in FIG. 2, the bond wire formation includes retracting the nozzle with the clamp 304 open. The example wirebonding process 300 continues in FIG. 5 where the position control apparatus extends the first bond wire portion 116 upward along the indicated direction 500. At 206 in FIG. 2 a main loop of the prospective bond wire 115 is formed to a prospective lead 114 of a starting lead frame panel. FIG. 6 shows one example, in which the nozzle 301 is moved laterally away from the semiconductor die bond pad along a direction of arrow 600 with the clamp 304 initially open. The clamp 304 is then closed as shown in FIG. 6 and the position control apparatus moves the nozzle 301 toward the conductive terminal 114 along the direction 600 in FIG. 6 while the clamp 304 remains closed.

Figure 7:
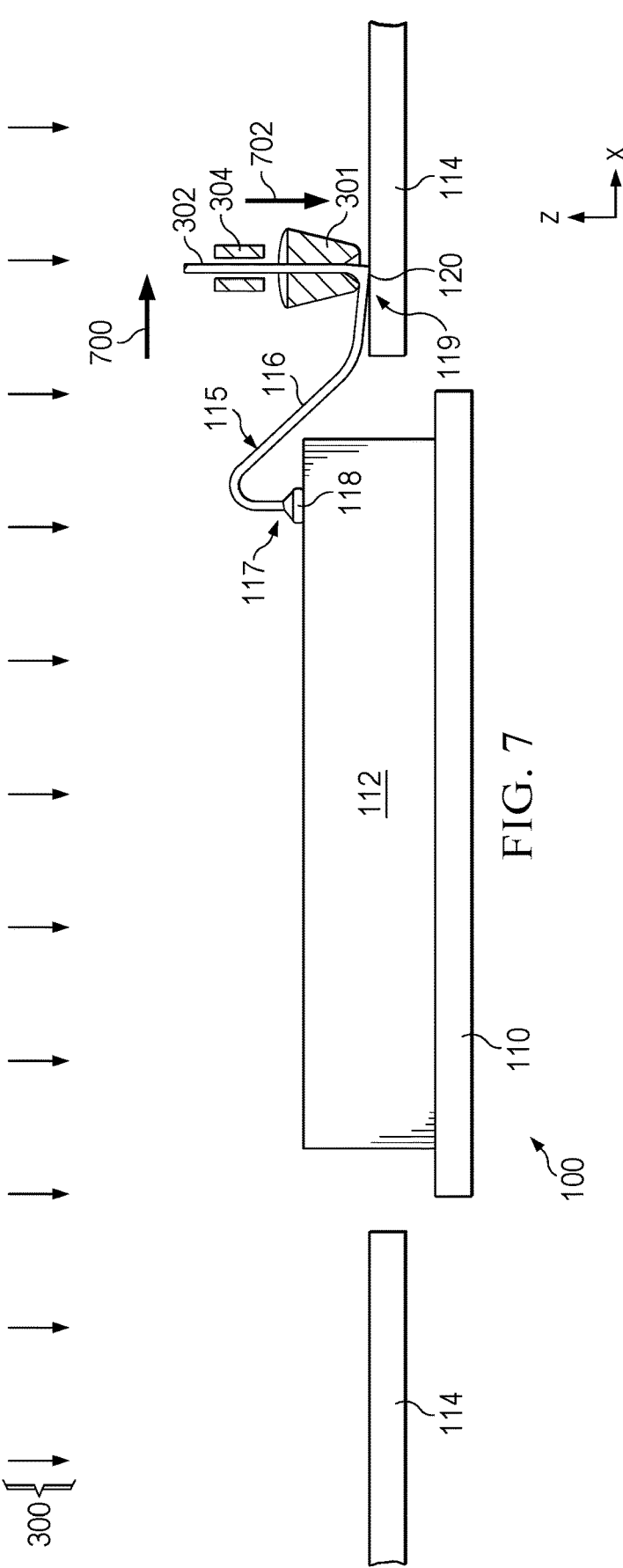

The wirebonding continues at 207 in FIG. 2 with coupling the second end 119 of the first portion 116 to the conductive terminal 114 by the second bond 120. In one example, the second bond 120 is a stitch bond. In another example, the second bond 120 is a wedge bond. The wire 302 is not separated after forming the second bond 120, and the second bond 120 also couples the first end 123 of a prospective second portion 122 of the bond wire 115 to the conductive terminal 114. FIG. 7 shows one example, in which the position control apparatus moves the nozzle 301 further laterally along the direction 700 until the center of the bond wire 302 in the nozzle 301 is positioned above a first portion of the conductive terminal 114 and then downward along the direction 702 to cause the second end 119 of the first portion 116 of the prospective bond wire 115 contacts the conductive terminal 114 as shown in FIG. 7. In various implementations, the coupling at 207 of the second end 119 of the first portion 116 and the first end 123 of the second portion 122 to the conductive terminal 114 includes forming the second bond 120 as a stitch bond or a wedge bond. In the illustrated example, the position control apparatus vibrates the nozzle at high (e.g., ultrasonic) frequencies to bond the second end 117 of the first bond wire portion 116 to the first portion of the top of the conductive terminal 114, for example, including lateral movement of the nozzle 301 back and forth along the X direction, or in a circular pattern in an X-Y plane, to form a stitch bond 120.

Figure 8:
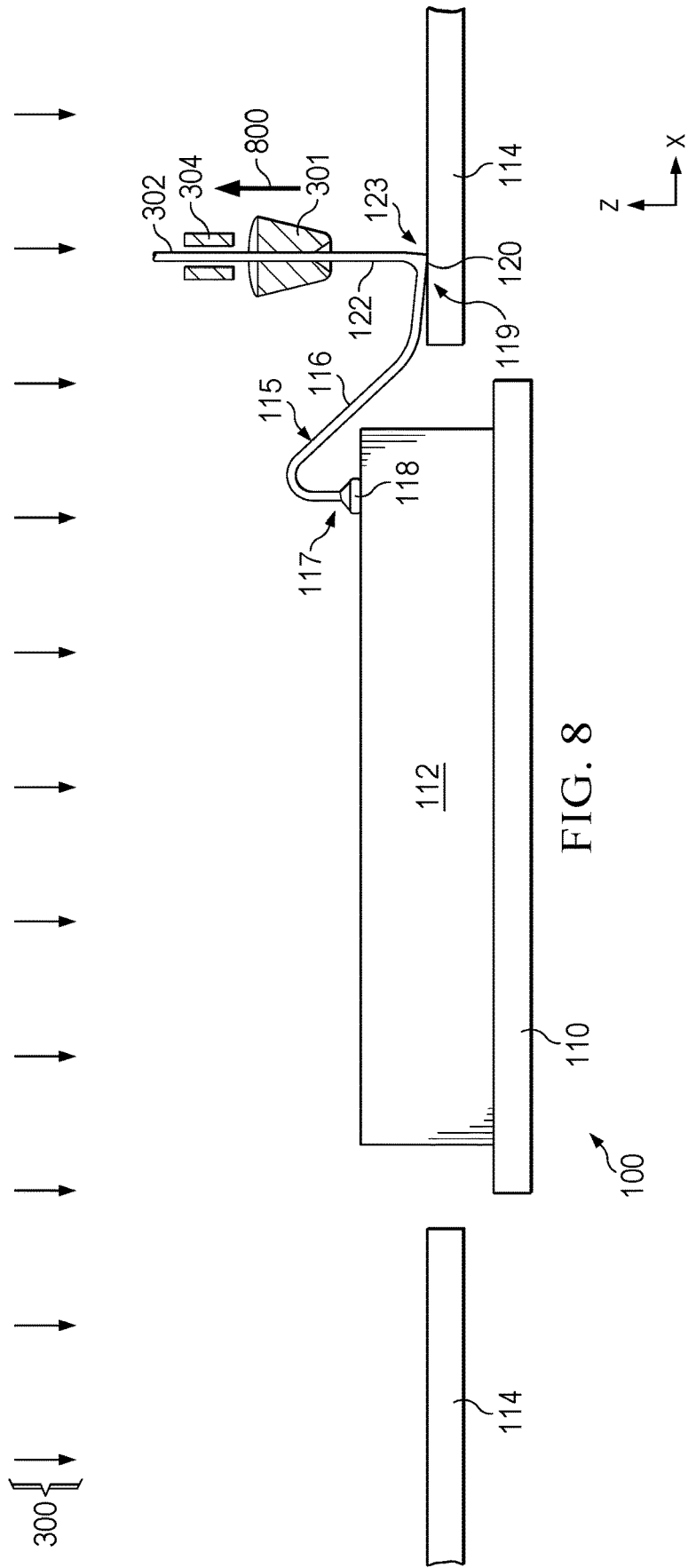

At 208 in FIG. 2, the process continues with formation of the contiguous second portion 122 of the prospective bond wire 115, including the first end 123 thereof that is already coupled to the conductive terminal 114 by the second bond 120, by retracting the nozzle 301 with the clamp 304 open. FIG. 8 shows one example, in which the clamp 304 is opened and the position control apparatus moves the nozzle 301 upward along the direction 800 further away from the conductive terminal 114 to extend the length of the second portion 122 under the nozzle 301.

Figure 9:
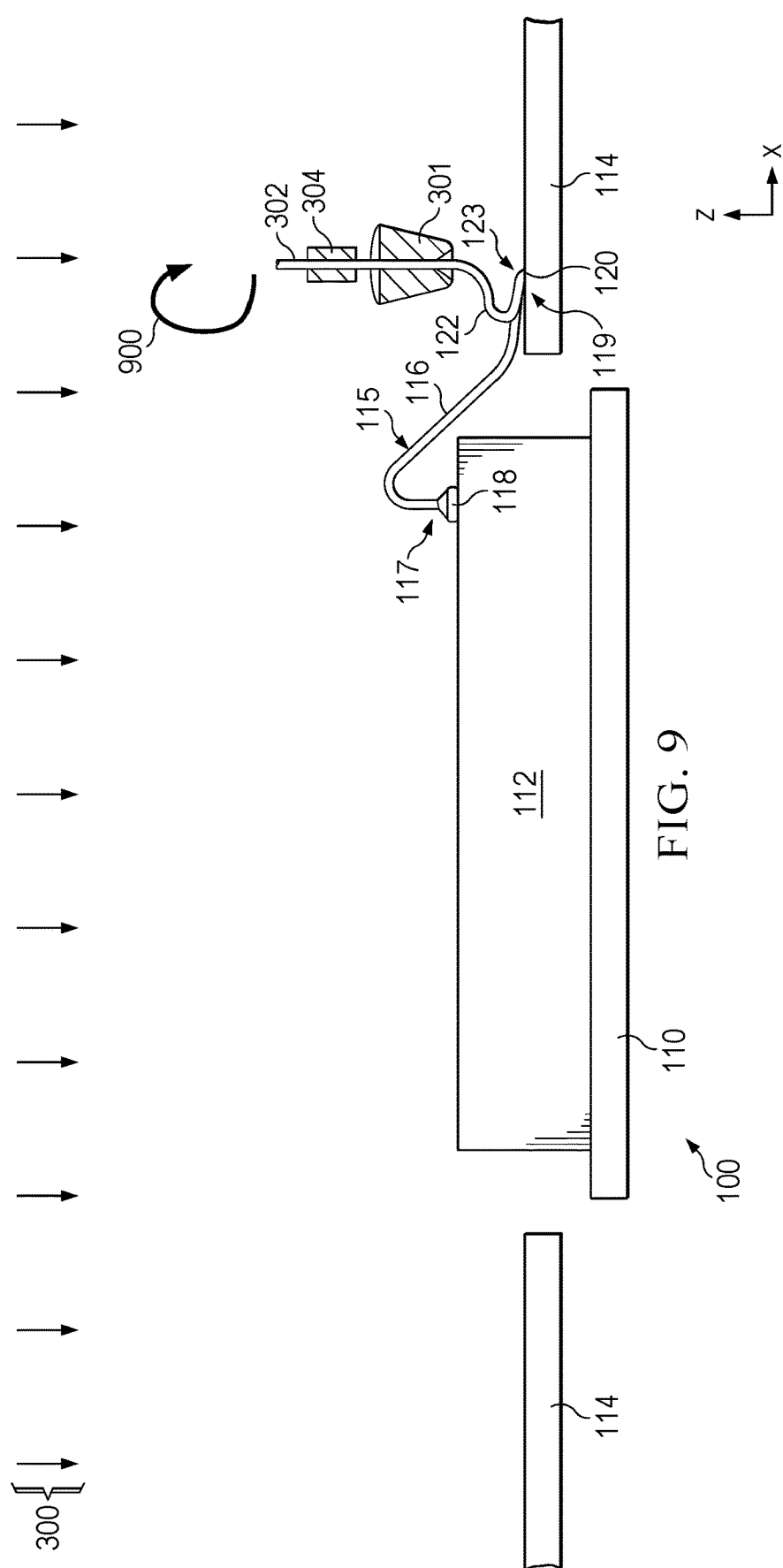

In one example, the second portion 122 is formed into a loop at 209 in FIG. 2. In other implementations, the second portion 122 is formed as a different shape by the wirebonding tool. FIG. 9 shows one example, in which the position control apparatus moves the nozzle 301 with the clamp 304 initially open in a curvilinear path illustrated by the arrow 900 that includes upward translation at least partially along the third direction Z and subsequent downward translation at least partially along the third direction Z, and which may, but need not include curves in the nozzle motion and/or in the shape of the finished second bond wire portion 122. In one example, the translation path 900 of the nozzle 301 is generally in an X-Z plane of the first and third directions X and Z. In other examples, the path 900 can extend or translate along the second direction Y alone (e.g., in a Y-Z plane) or in combination with translation along the first direction X.

Figure 10:
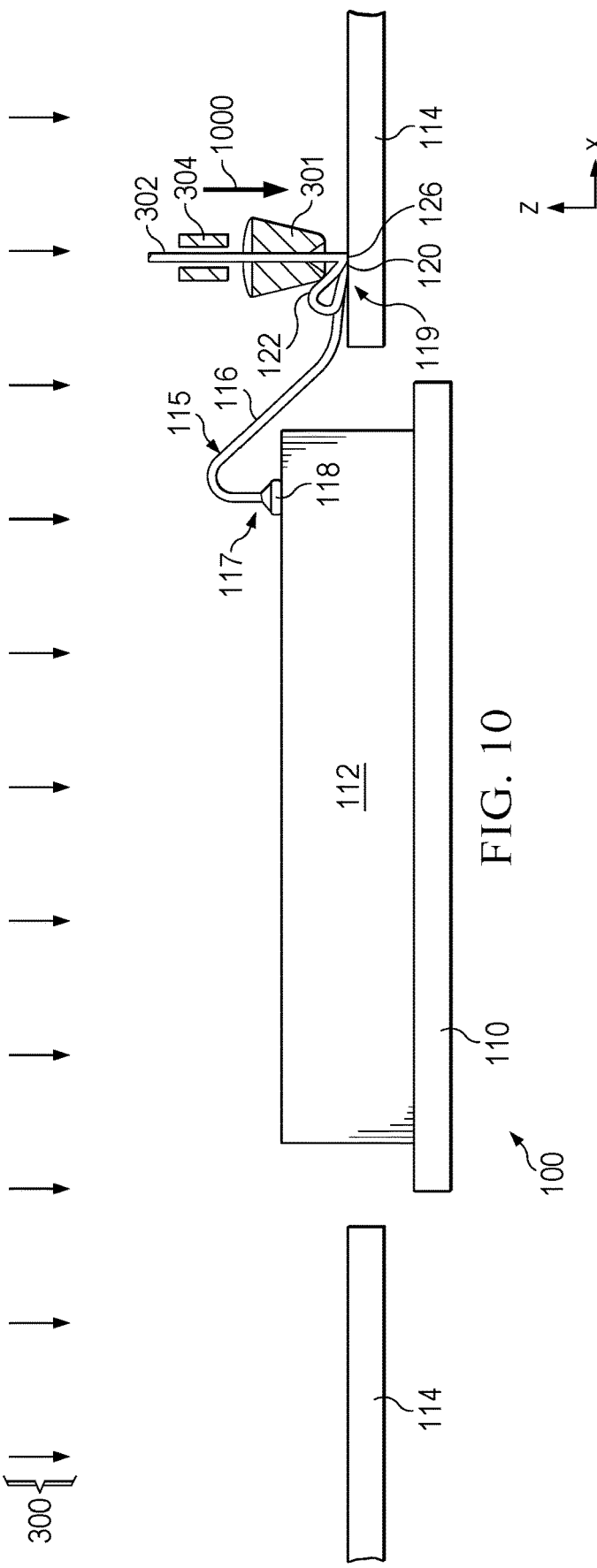

At 210 in FIG. 2, the second end 124 of the second portion 122 is coupled, directly or indirectly, to the conductive terminal 114 by forming the third bond 126. In one example, the coupling at 210 includes forming the third bond 126 as a stitch bond. FIG. 1B shows a non-limiting result for a loop shaped indirect connection example, and FIG. 1C shows another non-limiting loop shaped direct connection example. FIG. 10 shows an example of the third bond formation, in which the clamp 304 is closed and the position control apparatus moves the nozzle 301 toward the conductive terminal 114 along the direction 1000 while the clamp 304 remains closed. In the illustrated example of FIG. 10, the position control apparatus moves the nozzle 301 down at least partially on the first end 123 of the second portion 122 to form the prospective third bond 126 on the first end 123 of the second portion 122, to indirectly couple the second end 124 of the second portion 122 to the conductive terminal 114 (e.g., in forming a bond wire 115 as shown in FIG. 1B above). In another implementation, the position control apparatus moves the nozzle 301 down at a location on the conductive terminal 114 that is spaced apart from the first end 123 of the second portion 122 to form the prospective third bond 126 directly the conductive terminal 114 (e.g., FIG. 1C above)

Figure 11:
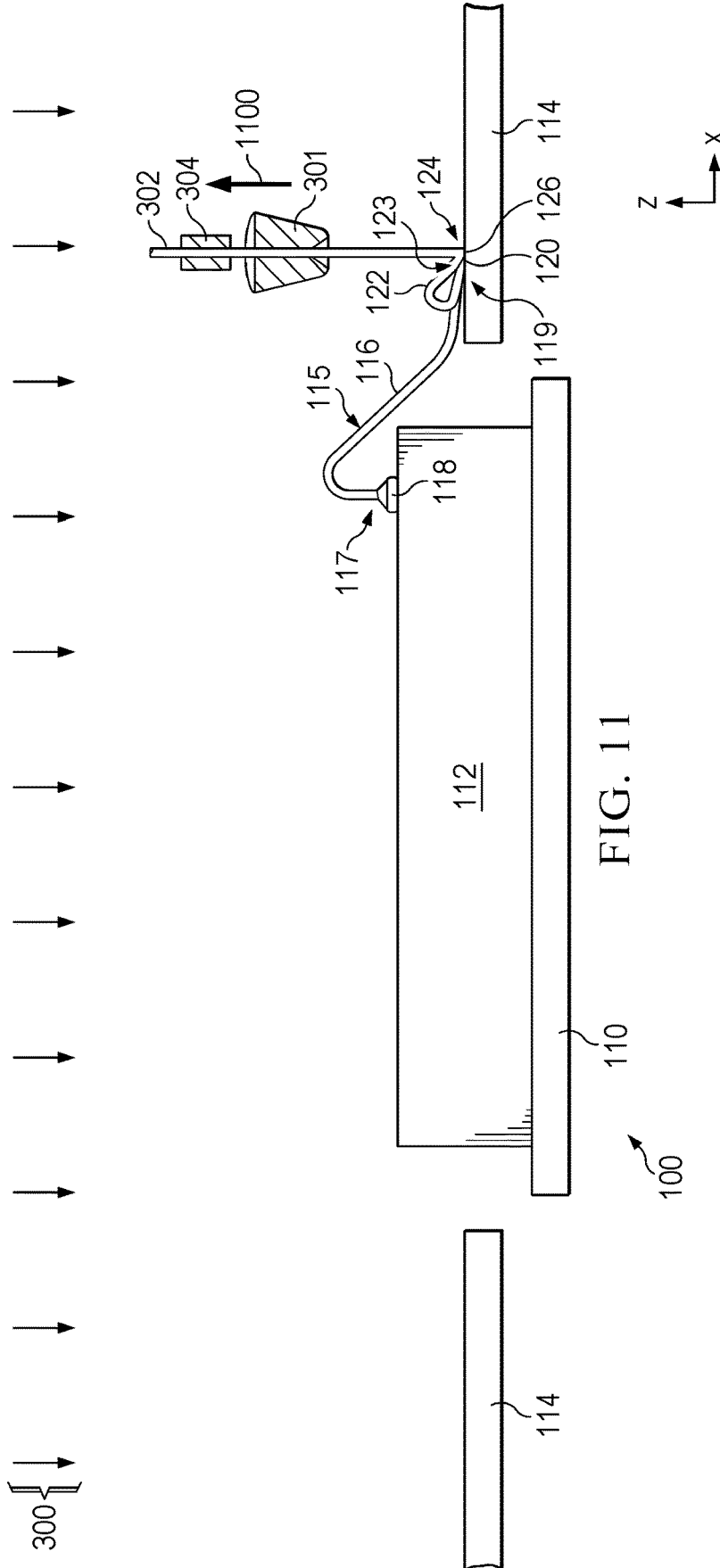

The wirebonding method 202 continues at 211 in FIG. 2, with retraction of the nozzle 301 to a suitable tail height. FIG. 11 shows one example, in which the position control apparatus moves the nozzle 301 upward along the third direction Z as shown by the direction arrow 1100 to a suitable tail height with the clamp 304 closed.

Figure 12:
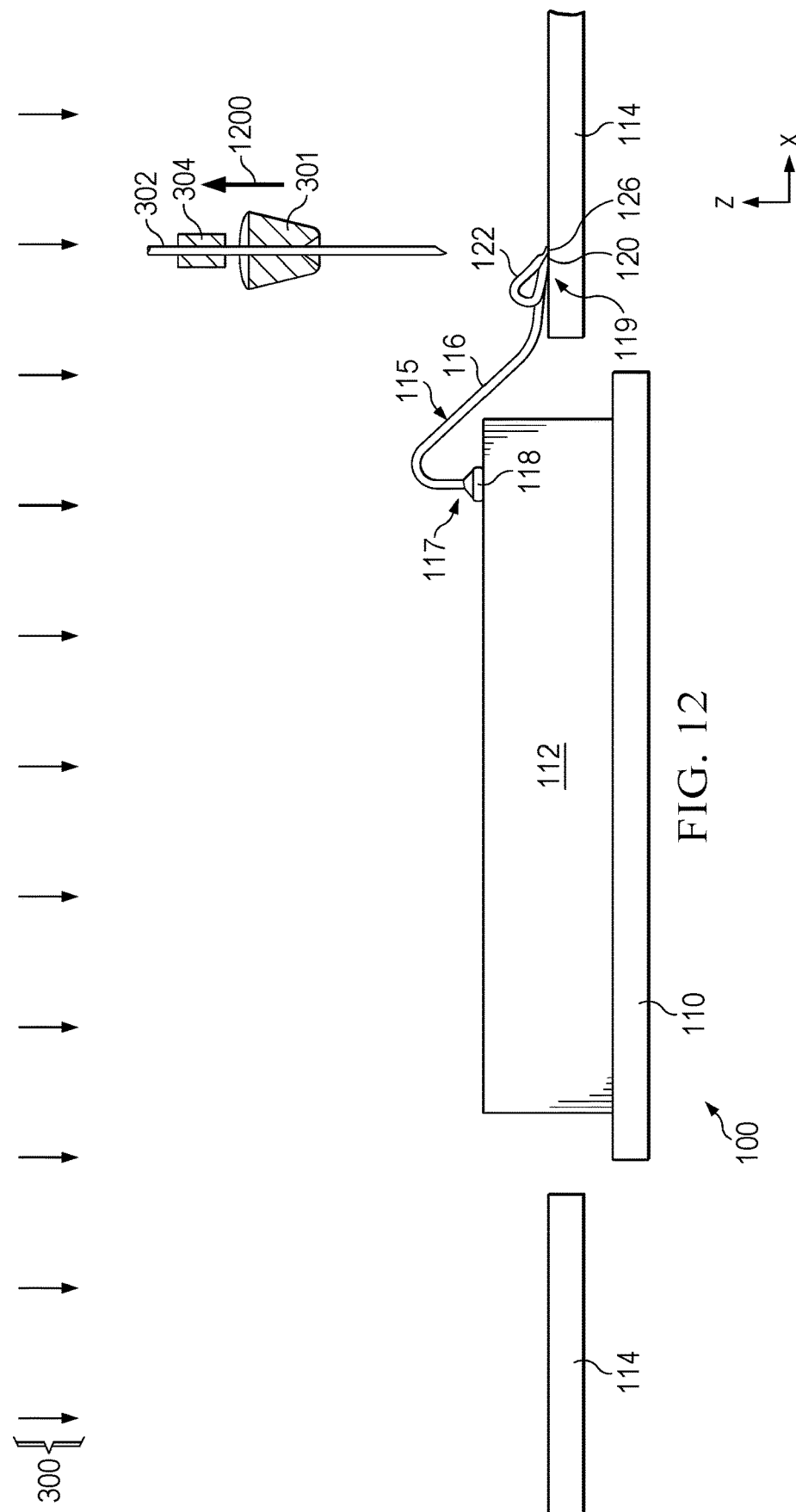

The wirebonding method 202 continues at 212 in FIG. 2 with nozzle retraction to tear off the tail of the wire 302. FIG. 12 shows one example, in which the position control apparatus moves the nozzle 301 further upward along the third direction Z as shown by the arrow 1200 to separate or break the wire 302 in the nozzle 301 from the second end 124 of the second portion 122 of the completed bond wire 115 to complete the third bond 126.

Figure 13:
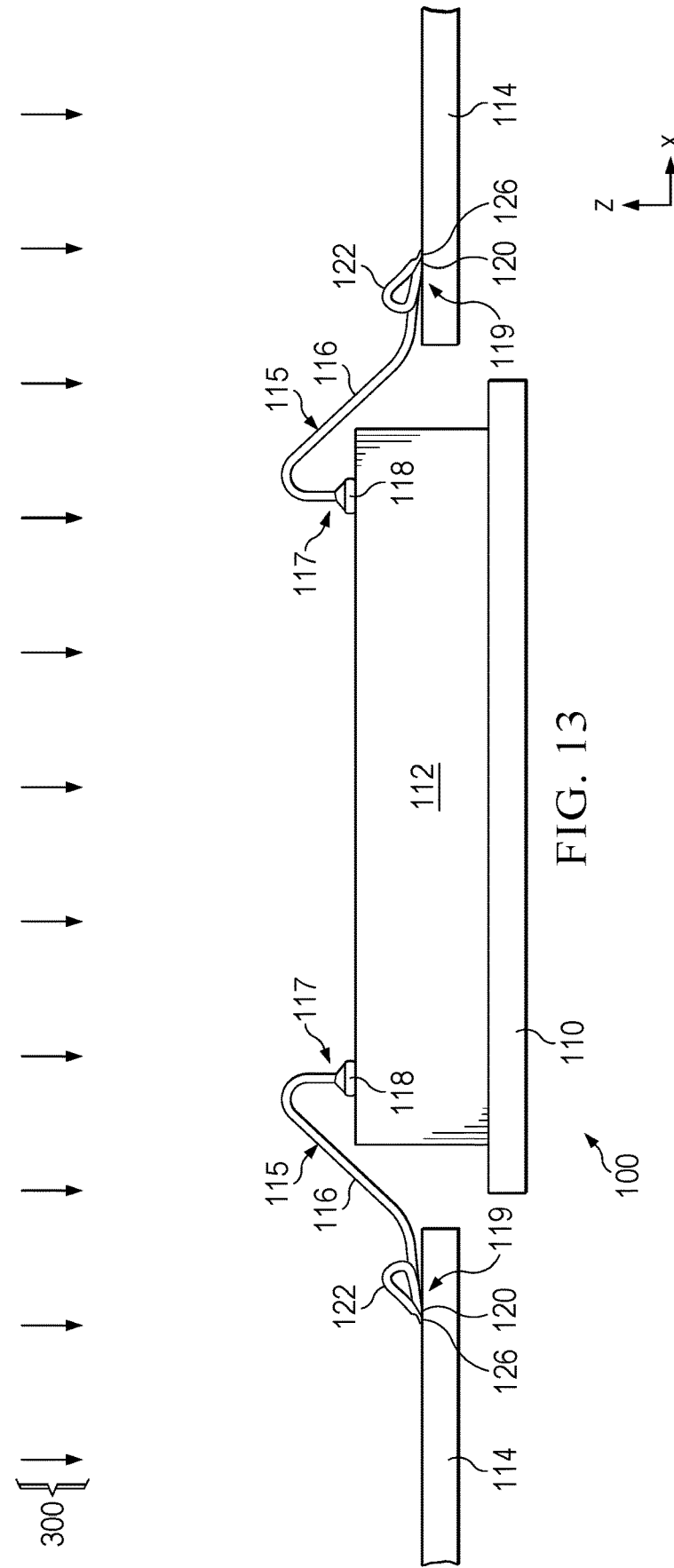

At 214 in FIG. 2, the wirebonding tool determines whether further bond wires are to be formed, for example, in an electronic device having multiple bond wire connections to be made. If so (YES at 214), the wirebonding method 202 returns to repeat the processing ad 203-212 for further bond wire connections as needed, some or all of which may include the steps at 208-210 to form the second bond wire portion 122. FIG. 13 shows one example, in which the above described wirebonding process 300 is repeated to form another bond wire 115 with first and second portions 116 and 122 as described above.

Figure 14:
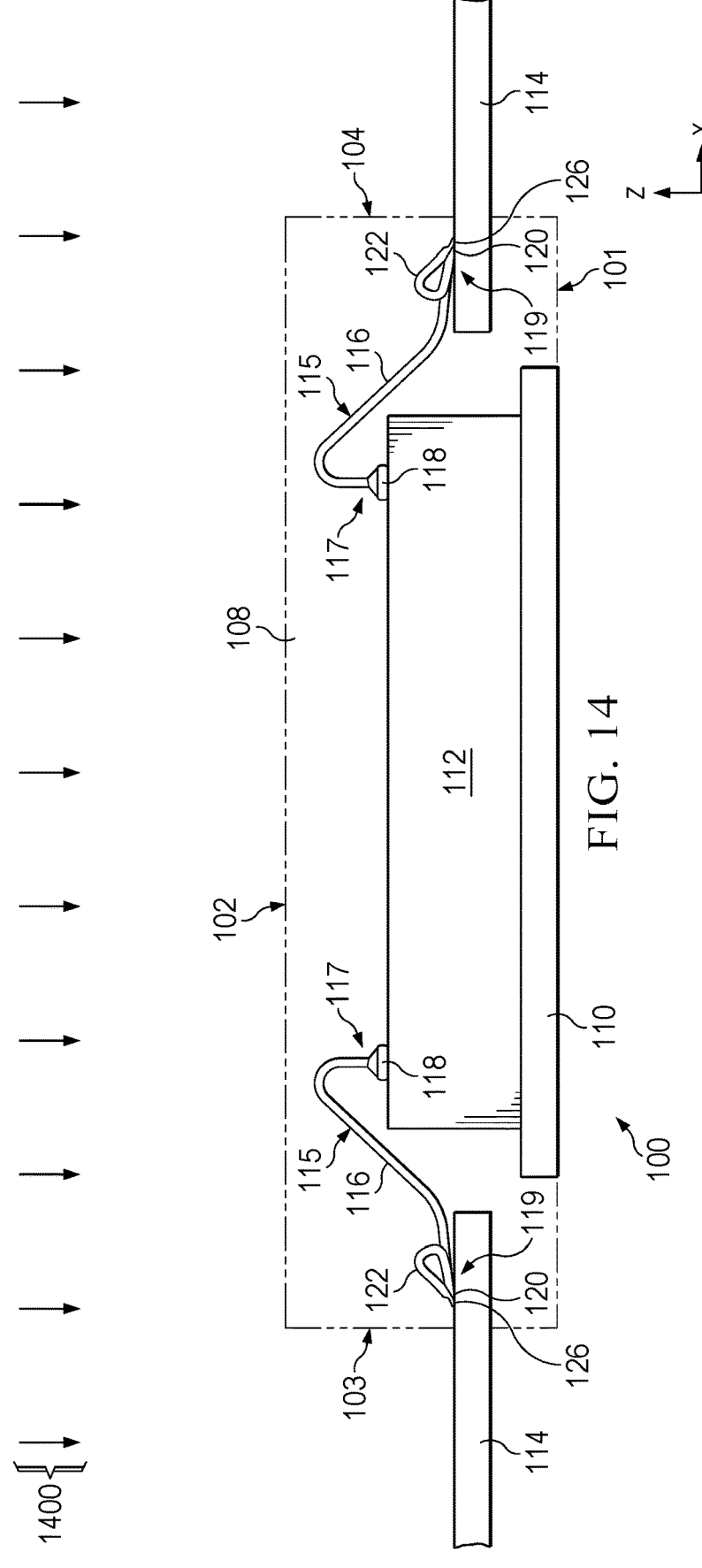

Once the wire bonding method 202 is completed (NO at 214), the electronic device fabrication process 200 continues in one example at 220 with package molding. FIG. 14 shows one example, in which a molding process 1400 is performed that encloses the semiconductor die 112, the bond wires 115 and interior portions of the conductive terminals 114 in the molded package structure 108.

Figure 15:
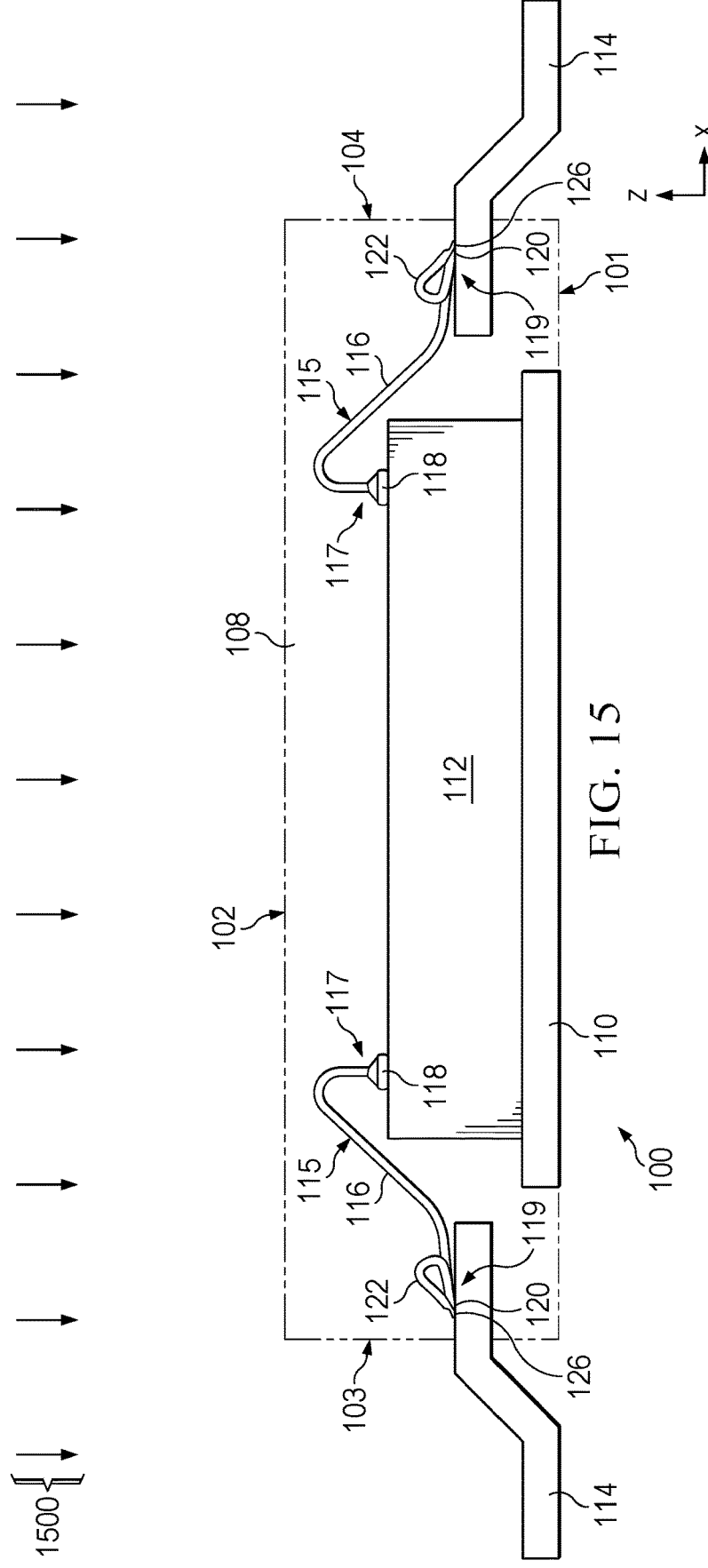

At 222 in FIG. 2, lead trimming and forming operations are performed along with package separation and other back end processing to provide multiple finished packaged electronic device products, such as the device 100 shown in FIG. 1 above. FIG. 15 shows one example, in which lead trimming and forming processing 1500 is performed that trims or otherwise separates the conductive terminals 114 from the starting lead frame panel and bends the trimmed terminals 114 into the desired gull wing shapes.

The finished device 100 has improved bond wire connections to the terminals 114 without the addition of significant manufacturing cost or complexity for improved device reliability. The wirebonding process 202 in FIG. 2 couples the second end 119 of the first portion 116 of the bond wire 115 and the first end 123 of the second portion 122 of the bond wire 115 to the conductive terminal 114 by a stich bond or a wedge bond 120, and directly or indirectly couples the second end 124 of the second portion 122 to the conductive terminal 114 by the stitch bond 126.

Modifications are possible in the described examples, and other implementations are possible, within the scope of the claims.

What is claimed is:

1. An electronic device, comprising:
a package structure;
a conductive terminal exposed outside the package structure;
a semiconductor die in the package structure; and
a bond wire enclosed by the package structure and having contiguous first and second portions, the first portion having a first end and a second end, the first end of the first portion connected to the semiconductor die by a first bond, the second end of the first portion connected to the conductive terminal by a second bond, the second portion having a first end and a second end, the first end of the second portion connected to the second end of the first portion, and the second end of the second portion connected to the conductive terminal by a third bond, wherein a loop formed by the second portion encircles a gap and the gap becomes narrower towards the third bond.

2. The electronic device of claim 1, wherein the third bond extends on the second end of the first portion.

3. The electronic device of claim 1, wherein the second bond is a stitch bond or a wedge bond.

4. The electronic device of claim 1, wherein the first bond is a ball bond.

5. The electronic device of claim 1, wherein the third bond is a stitch bond.

6. The electronic device of claim 1, wherein the third bond is spaced apart from the second end of the first portion.

7. The electronic device of claim 6, wherein the second bond is a stitch bond or a wedge bond.

8. The electronic device of claim 7, wherein the third bond is a stitch bond.

9. The electronic device of claim 6, wherein the first bond is a ball bond.

10. The electronic device of claim 6, wherein the third bond is a stitch bond.

11. The electronic device of claim 1, further comprising a die attach pad attached to the semiconductor die.

12. The electronic device of claim 1, wherein the second bond is in contact with the third bond.

13. The electronic device of claim 1, wherein the first end of the second portion is in contact with the second end of the second portion.

14. The electronic device of claim 1, wherein the second portion is configured to improve connection strength between the bond wire and the conductive terminal.

* * * * *